United States Patent
Hung et al.

(10) Patent No.: US 6,696,749 B1
(45) Date of Patent: Feb. 24, 2004

(54) PACKAGE STRUCTURE HAVING TAPERING SUPPORT BARS AND LEADS

(75) Inventors: Chin-Yuan Hung, Taichung Hsien (TW); Lien-Chen Chiang, Taichung (TW)

(73) Assignee: Siliconware Precision Industries Co., Ltd., Taichung Hsien (TW)

(*) Notice: Subject to any disclaimer, the term of this patent is extended or adjusted under 35 U.S.C. 154(b) by 54 days.

(21) Appl. No.: 09/669,005

(22) Filed: Sep. 25, 2000

(51) Int. Cl.[7] .................. H01L 23/495; H01L 23/48; H01L 23/52
(52) U.S. Cl. .................. 257/669; 257/666; 257/670; 257/676; 257/690; 257/784
(58) Field of Search ................ 257/666, 669, 257/670, 676, 690, 775

(56) References Cited

U.S. PATENT DOCUMENTS

| | | | |
|---|---|---|---|
| 5,521,428 A | * 5/1996 | Hollingsworth et al. | 257/670 |
| 5,594,234 A | * 1/1997 | Carter, Jr. et al. | 257/676 |
| 5,654,585 A | * 8/1997 | Nishikawa | 257/666 |
| 5,821,610 A | * 10/1998 | Nishikawa | 257/670 |
| 6,008,528 A | * 12/1999 | Go et al. | 257/670 |
| 6,211,462 B1 | * 4/2001 | Carter, Jr. et al. | 174/52.4 |
| 6,307,755 B1 | * 10/2001 | Williams et al. | 361/813 |
| 6,392,295 B1 | * 5/2002 | Iwaya et al. | 257/696 |

FOREIGN PATENT DOCUMENTS

| JP | 404014250 | * 1/1992 | ................ 23/50 |
|---|---|---|---|

OTHER PUBLICATIONS

IBM Technical Disclosure Bulletin, vol. 35, Issue 6, pp. 361 and 361, Fig. 1a–f, Nov. 1992.*

* cited by examiner

Primary Examiner—Eddie Lee
Assistant Examiner—Nitin Parekh
(74) Attorney, Agent, or Firm—J. C. Patents

(57) ABSTRACT

A package structure having tapering support bars and leads. The package structure has at least a lead frame, a die, a plurality of conductive wires and an encapsulating plastic body. The lead frame has a first surface and has at least a package unit. The package unit has a die pad, a plurality of leads and a plurality of support bars. The die pad is positioned in the middle. The leads and support bars are distributed around the periphery of the package unit. In addition, the width of the leads and support bars decreases gradually from a location close to the die pad towards the peripheral region. The leads and support bars have a rectangular or trapezoidal cross-section. A die is bonded on the surface of the die pad and the die is electrically connected to the leads on the lead frame via a plurality of conductive wires. Plastic material such as epoxy resin encloses the die, the conductive wires and the first surface of the lead frame.

11 Claims, 6 Drawing Sheets

PACKAGE STRUCTURE HAVING TAPERING SUPPORT BARS AND LEADS

BACKGROUND OF THE INVENTION

1. Field of Invention

The present invention relates to a package structure having tapering support bars and leads. More particularly, the present invention relates to a type of tapering support bar and lead used in the common lead frame of a quad flat non-leaded package.

2. Description of Related Art

Methods of manufacturing integrated circuits have developed quite rapidly. Besides the miniaturization of semiconductor devices, compact packages also have been developed. Nowadays, chip scale package (CSP) is one of the most common types of structures for housing a semiconductor chip. A chip scale package is only slightly larger than the semiconductor chip so that its volume occupation is relatively small and its signaling routes are relatively short. The carrier inside a chip scale package includes a lead frame, a flexible substrate and a rigid substrate. Because material cost of lead frames is low and easy to process, most chip scale packages use a lead frame. Quad flat non-leaded package (QFN) is one such lead frame based chip scale package. In general, a leadless chip scale package is used to encapsulate a low pin count semiconductor chip due to its short signaling route and small signal attenuation.

FIG. 1 is a schematic cross-sectional view of a conventional quad flat non-leaded package. FIG. 2 is a bottom view of the quad flat non-leaded package shown in FIG. 1.

As shown in FIGS. 1 and 2, structure and technique for fabricating a quad flat non-leaded package (QFN) is disclosed in U.S. Pat. No. 5,942,794 (Matsushita, 1999). The QFN structure is built around a lead frame. The lead frame has a die pad 100 in the middle surrounded by a plurality of leads 102. The QFN structure also includes a die 104 having an active surface 106 and a backside 108. The active surface 106 has a plurality of bonding pads 110 thereon serving as connection points from the die 104 to devices outside the package. The backside 108 of the die 104 is bonded to the die pad 100 using an adhesive material 112. The bonding pads 110 are electrically connected to the leads 102 using conductive wires 114. In general, the die 104, the die pad 100, the conductive wire 114 and the upper surface 118a of the leads 102 are enclosed by plastic material 116. Therefore, only the lower surface 118b and side surface 118c of the leads are exposed as external contacts.

In the fabrication of a leadless package, the interconnected packages must be separated into individual packages in a singulation process after the lead frame is encapsulated by a plastic material. However, sudden stress on the leads 102 or support bar section hardly can be avoided regardless if the singulation is conducted by sawing or punching. This type of impact often leads to a slight parting between the lead or support bar and the packaging material and results in delamination. Hence, moisture sensitivity level (MSL) of the product will be decreased, and reliability of the product is compromised.

SUMMARY OF THE INVENTION

Accordingly, one object of the present invention is to provide a lead frame having tapering support bars and leads capable of reducing delamination of the plastic material in an integrated circuit package and hence increasing reliability of the package.

To achieve these and other advantages and in accordance with the purpose of the invention, as embodied and broadly described herein, the invention provides a package having tapering support bars and leads. The package includes at least a lead frame, a die, a plurality of conductive wires and a plastic housing. The lead frame has a first surface and includes at least a package unit. The package unit includes a die pad, a plurality of leads and a plurality of support bars. The die pad is positioned in the middle. The leads and support bars are distributed around the periphery of the package unit. In addition, the width of the leads and support bars decreases gradually from a location close to the die pad towards the peripheral region. The leads and support bars have a rectangular or trapezoidal cross-section. A die is bonded on the surface of the die pad, and the die is electrically connected to the leads on the lead frame via a plurality of conductive wires. Plastic material such as epoxy resin encloses the die, the conductive wires and the first surface of the lead frame.

The gradual reduction of the width of the leads and support bars from a region close to the die pad towards the peripheral region of the package unit can reduce some of the pulling stress in a punch-shearing operation. Consequently, bonding strength between the leads and support bars on one hand and the encapsulating material on another is increased, and delamination of the plastic body of the package is prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
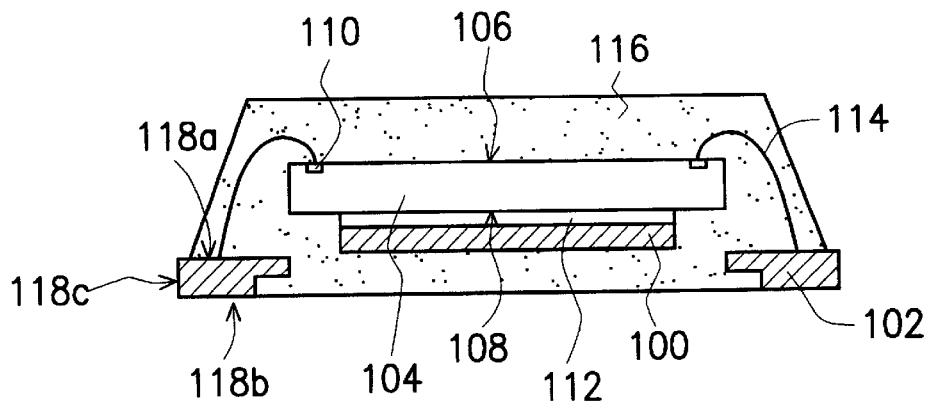
FIG. 1 is a schematic cross-sectional view of a conventional quad flat non-leaded package.
Figure 2:
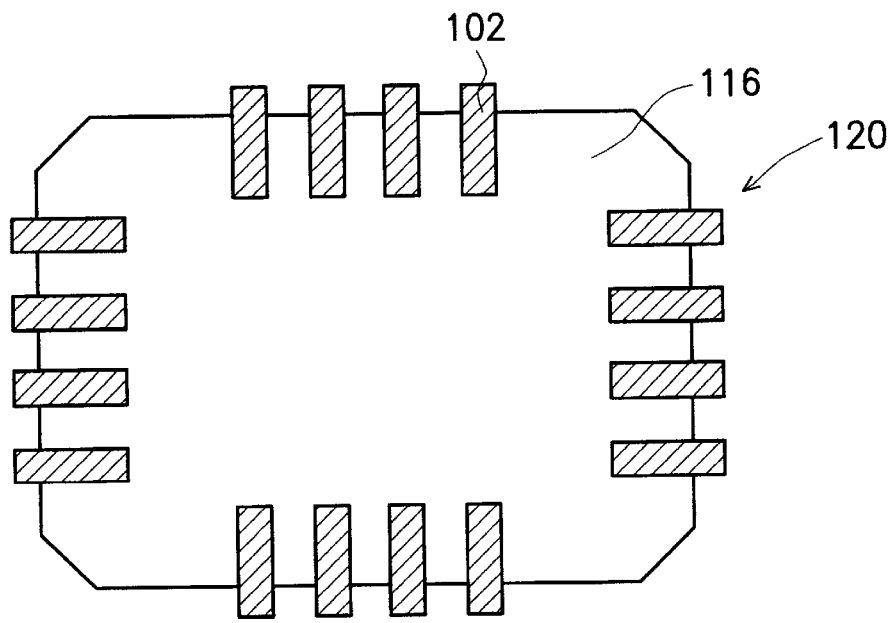
FIG. 2 is a bottom view of the quad flat non-leaded package shown in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
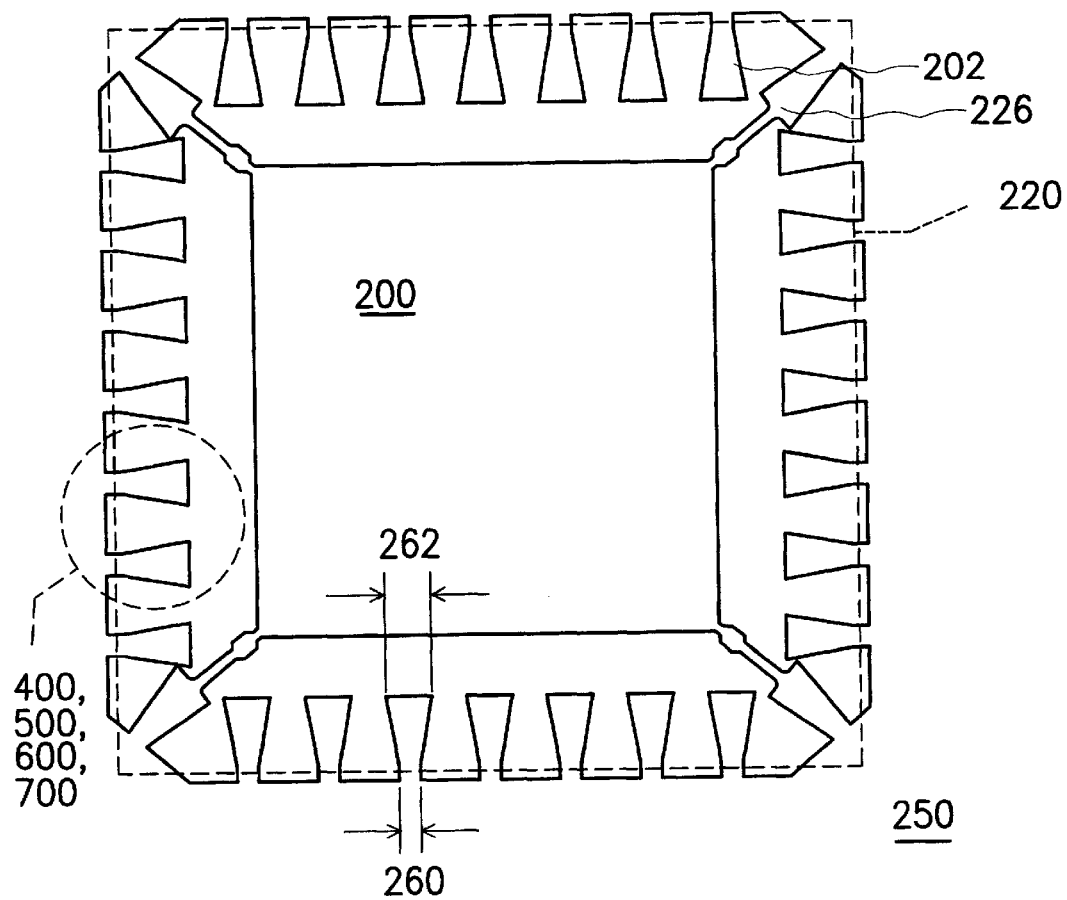
FIG. 3 is a top view showing a lead frame having tapering leads and support bars packaging structure according to one preferred embodiment of this invention.

FIG. 3 is a top view showing a lead frame having tapering leads and support bars packaging structures according to one preferred embodiment of this invention.

As shown in FIG. 3, the lead frame 250 is suitable for producing a package structure of this invention. Each lead frame 250 can have only one package unit or a plurality of package units arranged to form a linear strip or an array. In this embodiment, only a single package unit in a lead frame is shown to simplify the illustration. Each package unit includes a die pad 200, a plurality of leads 202 and a plurality of support bars 226. The die pad 200 occupies a central location in the package unit. The die pad 200 is fixed in a position relative to the rest of the lead frame 250 by the support bars 226. The leads 202 are distributed around the peripheral region of the package unit. The width of the leads 202 and support bars 226 decreasess gradually from a width 262 at a position close to the die pad 200 to a width 260 near the peripheral region of the package unit. Magnified views 400, 500, 600 and 700 of the portion enclosed by a dashed circle will be shown later in FIGS. 4 to 7. The outline of package outline 220, in other words, the encapsulation boundary, is shown as a dashed line in FIG. 3. A die is attached to the upper surface of the die pad 200. The die is electrically connected to the leads 202 of the lead frame 250 via a plurality of conductive wires. Finally, the die, the conductive wires and one side of the lead frame 250 with the die attached is encapsulated by a molding compound such as an epoxy resin.

The die is attached to the die pad 200 using an adhesive material such as silver paste. The conductive wires are made from gold or aluminum. The lead frame 250 is made from a copper alloy (Alloy 194, C7025, KCF125 or EFTEC and so on) or a nickel-iron alloy (Ni-Fe 42 Alloy). Surfaces of the lead frame 250 can be electroplated to improve surface properties such as resistance to corrosion, bondability, molderability and solderability.

In a singulation process, various package units in an interconnected lead frame 250 are separated from each other by sawing with a blade or shearing with a punching press. A portion of the leads 202 outside the package body is also severed, thereby forming a leadless package. Some bled-out plastic material is also removed during the singulation process. Note that the aforementioned lead frame usually comprises of a plurality of packaging units arranged into a strip or an array. Packaging can be conducted serially so that one packaging unit is formed at a time. Alternatively, a plurality of packaging units can be molded together followed by an encapsulating process.

Figure 4A:
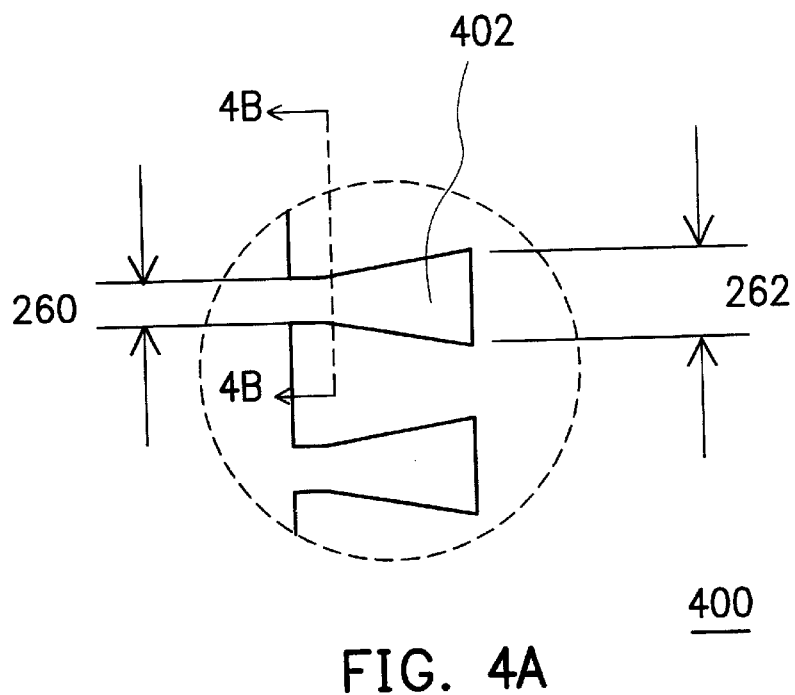
FIG. 4A is a top view of a magnified lead frame lead according to a first embodiment of this invention.

FIG. 4A is a top view of a magnified lead frame lead according to a first embodiment of this invention. As shown in FIG. 4A, the width of the lead 402 gradually decreases from a width 262 close to the die pad to a width 260 close to the peripheral region of the packaging unit.

Figure 4B:
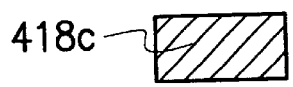
FIG. 4B is a cross-sectional view of the lead according to the first embodiment of this invention.
Figure 4C:
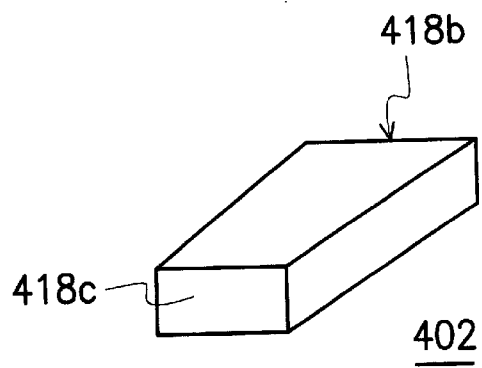
FIG. 4C is a perspective view of the lead according to the first embodiment of this invention.

FIG. 4B is a cross-sectional view of the lead according to the first embodiment of this invention. FIG. 4C is a perspective view of the lead according to the first embodiment of this invention.

As shown in FIGS. 4B and 4C, the lead 402 has a rectangular cross-section. Since the outer rim 418c of the lead 402 has a smaller cross-sectional area than the inner rim 418b of the lead 402, pulling stress resulting from shearing off the lead by a punch after packaging is greatly reduced.

Figure 5A:
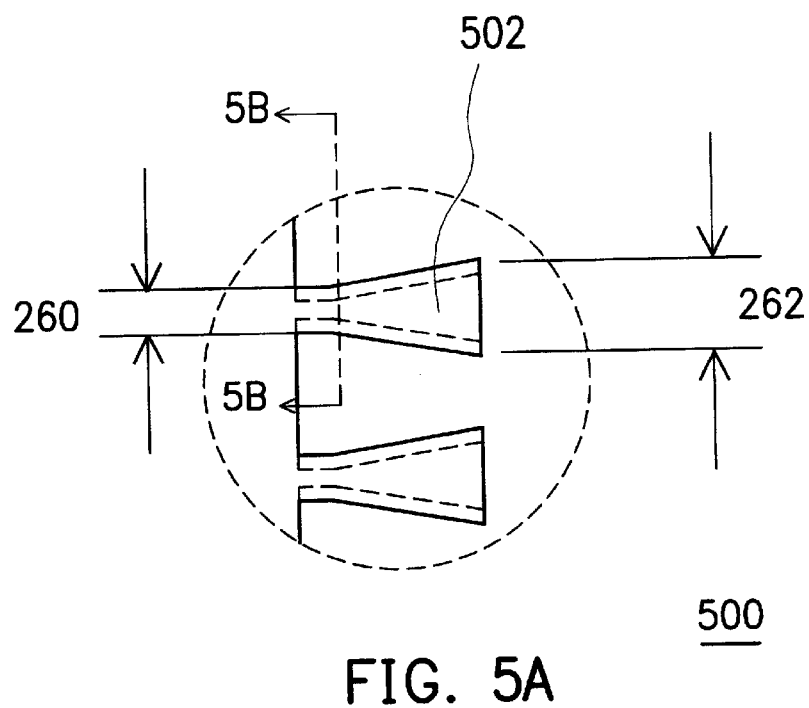
FIG. 5A is a top view of a magnified lead frame lead according to a second embodiment of this invention.

FIG. 5A is a top view of a magnified lead frame lead according to a second embodiment of this invention. As shown in FIG. 5A, the width of the lead 502 gradually decreases from a width 262 close to the die pad to a width 260 close to the peripheral region of the packaging unit.

Figure 5B:
FIG. 5B is a cross-sectional view of the lead according to the second embodiment of this invention.
Figure 5C:
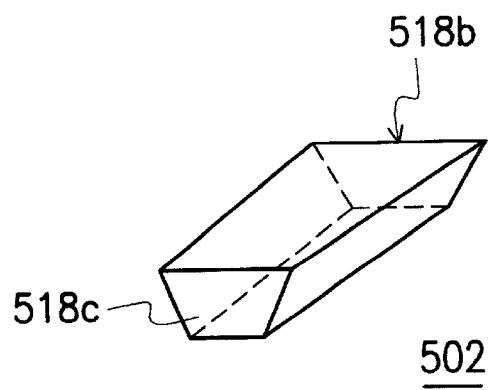
FIG. 5C is a perspective view of the lead according to the second embodiment of this invention.

FIG. 5B is a cross-sectional view of the lead according to the second embodiment of this invention. FIG. 5C is a perspective view of the lead according to the second embodiment of this invention.

As shown in FIGS. 5B and 5C, the lead 502 has a trapezoidal cross-section. Since the outer rim 518c of the lead 502 has a smaller cross-sectional area than the inner rim 518b of the lead 502, pulling stress resulting from shearing off the lead by a punch after packaging is greatly reduced.

Figure 6A:
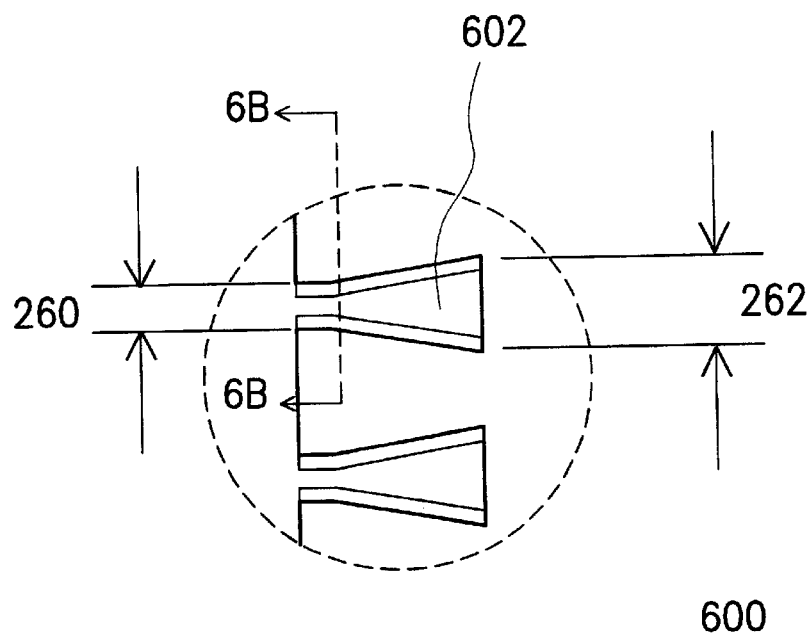
FIG. 6A is a top view of a magnified lead frame lead according to a third embodiment of this invention.

FIG. 6A is a top view of a magnified lead frame lead according to a third embodiment of this invention. As shown in FIG. 6A, the width of the lead 602 gradually decreases from a width 262 close to the die pad to a width 260 close to the peripheral region of the packaging unit.

Figure 6B:
FIG. 6B is a cross-sectional view of the lead according to the third embodiment of this invention.
Figure 6C:
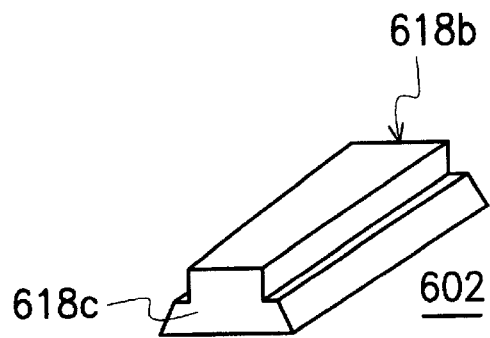
FIG. 6C is a perspective view of the lead according to the third embodiment of this invention.

FIG. 6B is a cross-sectional view of the lead according to the third embodiment of this invention. FIG. 6C is a perspective view of the lead according to the third embodiment of this invention.

As shown in FIGS. 6B and 6C, the lead 602 has a staircase cross-section. Since the outer rim 618c of the lead 602 has a smaller cross-sectional area than the inner rim 618b of the lead 602, pulling stress resulting from shearing off the lead by a punch after packaging is greatly reduced.

Figure 7A:
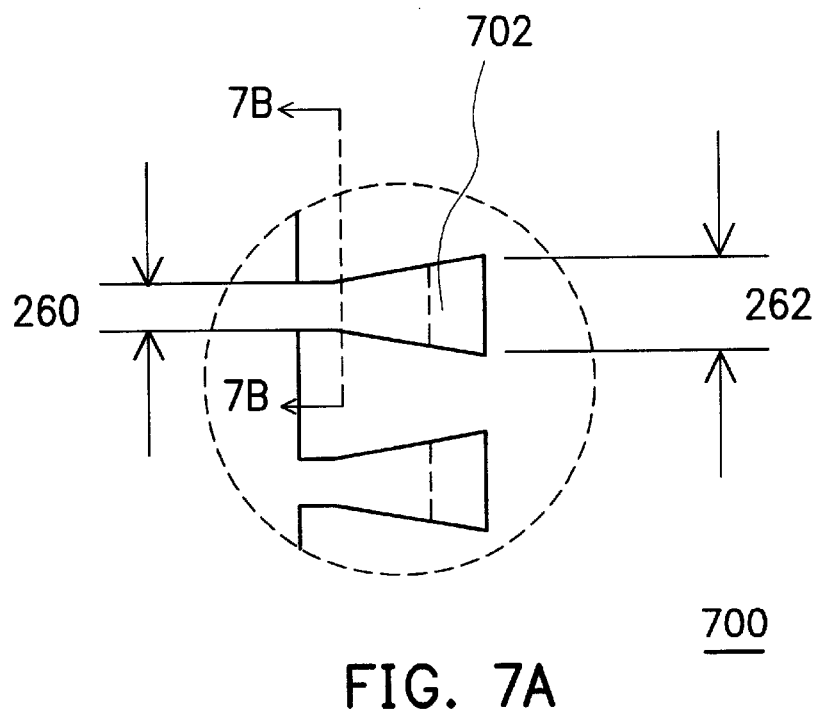
FIG. 7A is a top view of a magnified lead frame lead according to a fourth embodiment of this invention.

FIG. 7A is a top view of a magnified lead frame lead according to a fourth embodiment of this invention. As shown in FIG. 7A, width of the lead 702 gradually decreasess from a width 262 close to the die pad to a width 260 close to the peripheral region of the packaging unit.

Figure 7B:
FIG. 7B is a cross-sectional view of the lead according to the fourth embodiment of this invention.
Figure 7C:
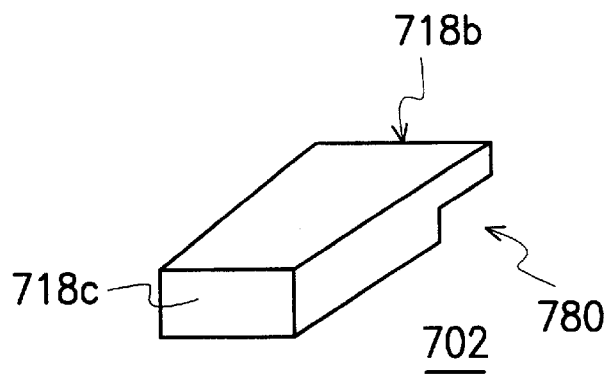
FIG. 7C is a perspective view of the lead according to the fourth embodiment of this invention.

FIG. 7B is a cross-sectional view of the lead according to the fourth embodiment of this invention. FIG. 7C is a perspective view of the lead according to the fourth embodiment of this invention.

As shown in FIGS. 7B and 7C, the lead 702 has a rectangular cross-section. Since the outer rim 718c of the lead 702 has a smaller cross-sectional area than the inner rim 718b of the lead 702, pulling stress resulting from shearing off the lead by a punch after packaging is greatly reduced. Notice that the lead 702 has a step change in cross-sectional area somewhere along its length close to the die pad. The purpose of having such a step is to increase contact area between the lead 702 and the molding material so that delamination between the lead and the molding compound is reduced.

All the leads 402, 502, 602, 702 shown in FIGS. 4 through 7 are capable of reducing delamination of packaging material due to impact during the singulation process so that overall moisture sensitivity level of the package is increased. Similarly, the support bars also have a variable cross-section such that the cross-sectional area closer to the die pad is greater than the cross-sectional area closer to the peripheral region.

In summary, the advantages of this invention includes:
1. The capacity for preventing any loosening of the lead in the package even if package singulation is conducted by sawing or punch.
2. The capacity for preventing delamination between molding compound and leads so that the package may have a greater moisture resistance and higher reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure with tapering support bars and leads, comprising:

a lead frame having at least one packaging unit that includes a die pad, a plurality of leads and a plurality of support bars, wherein the leads and the support bars are distributed around the die pad, and each lead consists of a geometric cross-section with a width that gradually decreases from a distal end surface of the lead facing the die pad to an opposite end of the lead close to the boundary of the packaging unit;

a die attached to the die pad on a first surface of the lead frame;

a plurality of conductive wires for electrically connecting the die to the leads on the lead frame; and a packaging material that encloses the die, the conductive wires and the first surface of the lead frame, while a second surface of the lead frame at a bottom is exposed outside the packaging material to configure a quad flat non-leaded package.

2. The package structure of claim 1, wherein the leads and the support bars have a rectangular cross-section.

3. The package structure of claim 1, wherein the leads and the support bars have a trapezoidal cross-section.

4. The package structure of claim 1, wherein the leads and the support bars have a staircase cross-section.

5. The package structure of claim 1, wherein the leads and the support bars have a step change in cross-sectional profile close to the die pad.

6. The package structure of claim 1, wherein the packaging material includes epoxy resin.

7. The package structure of claim 1, wherein the adhesive material for attaching the die to the die pad includes silver paste.

8. A lead frame for a semiconductor package, comprising:

a die pad in a center portion of the lead frame; and a plurality of leads and support bars, wherein the leads and the support bars are distributed around the die pad, and each lead consists of a rectangular cross-section with a width that gradually decreases from a distal end surface of the lead facing the die pad to an opposite end of the lead along the outwardly extending direction, wherein only a lower surface of the leads is exposed as external contacts to configure a quad flat non-leaded lead frame.

9. A lead frame for a semiconductor package, comprising:

a die pad in a center portion of the lead frame; and a plurality of leads and support bars, wherein the leads and the support bars are distributed around the die pad, and each lead consists of a trapezoidal cross-section with a width that gradually decreases from a distal end surface of the lead facing the die pad to an opposite end of the lead along the outwardly extending direction wherein only a lower surface of the leads is exposed as external contacts to configure a quad flat non-leaded lead frame.

10. A lead frame for a semiconductor package, comprising:

a die pad in a center portion of the lead frame; and a plurality of leads and support bars, wherein the leads and the support bars are distributed around the die pad, and each lead consists of a staircase cross-section with a width that gradually decreases from a distal end surface of the lead facing the die pad to an opposite end of the lead along the outwardly extending direction, wherein only a lower surface of the leads is exposed as external contacts to configure a quad flat non-leaded lead frame.

11. A lead frame for a semiconductor package, comprising:

a die pad in a center portion of the lead frame; and a plurality of leads and support bars, wherein the leads and the support bars are distributed around the die pad, and each lead has consists of a step profile with a width that gradually decreases from a distal end surface of the lead facing the die pad to an opposite end of the lead along the outwardly extending direction, wherein only a lower surface of the leads is exposed as external contacts to configure a quad flat non-leaded lead frame.

* * * * *